United States Patent [19]
Cho et al.

[11] Patent Number: 5,200,030
[45] Date of Patent: Apr. 6, 1993

[54] METHOD FOR MANUFACTURING A PLANARIZED METAL LAYER FOR SEMICONDUCTOR DEVICE

[75] Inventors: Gyung S. Cho; Chul G. Ko; Heon D. Kim, all of Seoul, Rep. of Korea

[73] Assignee: Hyundai Electronics Industries Co., Ltd., Rep. of Korea

[21] Appl. No.: 780,891

[22] Filed: Oct. 23, 1991

[30] Foreign Application Priority Data

Oct. 25, 1990 [KR] Rep. of Korea ............... 90-17093

[51] Int. Cl.⁵ .................. B44C 1/22; C03C 15/00; C03C 25/06
[52] U.S. Cl. ...................... 156/657; 156/644; 437/194; 437/203; 437/246
[58] Field of Search ............... 156/643, 644, 646, 657, 156/659.1; 204/192.37; 437/189, 194, 203, 238, 246; 357/71

[56] References Cited

U.S. PATENT DOCUMENTS

| | | | |
|---|---|---|---|
| 4,631,806 | 12/1986 | Poppert et al. | 437/203 X |
| 4,812,419 | 3/1989 | Lee et al. | 437/203 |
| 4,936,950 | 6/1990 | Doan et al. | 437/203 |
| 4,987,099 | 1/1991 | Flanner | 437/24 |

Primary Examiner—William A. Powell
Attorney, Agent, or Firm—Ladas & Parry

[57] ABSTRACT

A method for manufacturing a planarized metal layer on a wafer of a semiconductor device by providing a wafer and sequentially depositing a conducting layer 1 and an insulating layer 2 on the wafer 10 is described. A contact hole is formed in a portion of the insulating layer 2 exposing a portion of the underlying conducting layer 1 and simultaneously forming a step difference. The resulting wafer 10 comprising the contact hole is placed into a first chamber and heated in order to degas the insulating layer 2 and a first metal layer 3 is deposited on the degassed insulating layer 2 and on the contact hole 5 to a thickness of about 10 to 50% of the desired predetermined final thickness. The resulting wafer comprising the first metal layer is placed into a second chamber and heated. A second metal layer 4 is then deposited on the first metal layer 3 to a thickness of about 50 to 90% of the desired predetermined final thickness to provide a planarized metal layer.

21 Claims, 1 Drawing Sheet

METHOD FOR MANUFACTURING A PLANARIZED METAL LAYER FOR SEMICONDUCTOR DEVICE

BACKGROUND OF INVENTION

1. Field of the Invention

The invention relates to a method for manufacturing a planarized metal layer for a semiconductor device, and more particularly, to a method for manufacturing a planarized metal layer by depositing a first metal layer and then a second metal layer on the first metal layer such that the coverage of the step difference resulting from the formation of a contact hole is improved.

As the semiconductor device becomes more integrated, the area of the contact region provided for a certain purpose of the device decreases, so that the related aspect ratio increases. When the area of the contact region decreases and the aspect ratio increases, even coverage of the step difference decreases, thereby deteriorating the quality of the resulting device.

2. Information Disclosure Statement

Generally, in the prior art process of depositing a metal layer on a wafer, the temperature, power and pressure of the chamber are the important factors which effect the step coverage of the resulting metal layer. One method of improving the step coverage of the metal layer is to adjust the power and the pressure of the chamber. However, there is a limit to the extent of improvement in the step coverage according to the prior art process. Another method of improving the step coverage of the metal layer is by adjusting the temperature. However, a problem occurs if the temperature is undesirably high. Here the metal layer deposited on the contact hole or the via hole is diffused, resulting in a disconnected metal layer. Also, if the temperature is undesirably low, the aspect ratio of the step coverage is below 10%. Furthermore, since the metal layer is formed by utilizing a single sputtering chamber, planarization of the resulting metal layer cannot be obtained.

Therefore, it is an object of the present invention to solve the problems set forth in the prior art.

It is a further object of the present invention to provide an economical method to manufacture a level metal layer in a semiconductor device.

It is a further object of the present invention to provide a method for manufacturing a planarized metal layer for a semiconductor device by utilizing a pair of chambers with each chamber having a different temperature.

It is a further object of the present invention to provide a method for manufacturing a planarized metal layer for a semiconductor device wherein the final metal layer is a combined layer consisting of a first metal layer and a second metal layer deposited under different conditions.

It is a further object of the present invention to provide a method for manufacturing a metal layer having the predetermined thickness of the prior art metal layer, but which is a planarized metal layer consisting of a first metal layer and a second metal layer.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The method for manufacturing a planarized metal layer for a semiconductor device of the present invention is defined by the claims with a specific embodiment shown in the attached drawings. For the purpose of summarizing the invention, the invention relates to a method for manufacturing a planarized metal layer on a structure having a step difference in a semiconductor wafer, the method comprises sequentially depositing a conducting layer and an insulating layer on a wafer for a semiconductor device. A contact hole is formed in a portion of the insulating layer exposing a portion of the underlying conducting layer and simultaneously forming a step difference, which is the difference in height between the top of the insulating layer and the conducting layer exposed at the bottom of the contact hole, i.e. the depth or thickness of the insulating layer. The contact hole is preferably formed by dry-etching a portion of the insulating layer by a contact mask patterning process.

The resulting wafer is then placed into a first chamber and heated in order to degas the insulating layer and to deposit a first metal layer on the degassed insulating layer and contact hole. The first metal layer is deposited to a thickness of about 10 to 50% of the desired predetermined final thickness of the final metal layer. The insulating layer is preferably degassed in the first chamber at a temperature of above 400 degrees Celsius for a period of two minutes. The degassed insulating layer is preferably allowed to cool to room temperature before the first metal layer is deposited on the wafer. The first metal layer is preferably deposited on the insulating layer at a temperature of below 150 degrees Celsius to ensure the continuity of the first metal layer on the insulating layer and the contact hole and the exposed conducting layer at the bottom of the contact hole.

The resulting wafer, which now comprises the first metal layer, is placed into a second chamber and heated, preferably to a temperature of above 400 degrees Celsius, and a second metal layer is deposited on the first metal layer to a thickness of about 50 to 90% of the desired predetermined final thickness to provide a planarized metal layer. The resulting wafer, comprising the first metal layer deposited on the insulating layer, is preferably heated in the second chamber to a temperature of above 400 degrees Celsius for a period of 1 minute.

The preferred thickness of the first metal layer deposited on the degassed insulating layer and on the contact hole is about 30% of the desired predetermined final thickness of the metal layer and that of the second metal layer is about 70% of the desired predetermined final thickness of the metal layer.

The first and second metal layer are preferably aluminum or an aluminum alloy.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
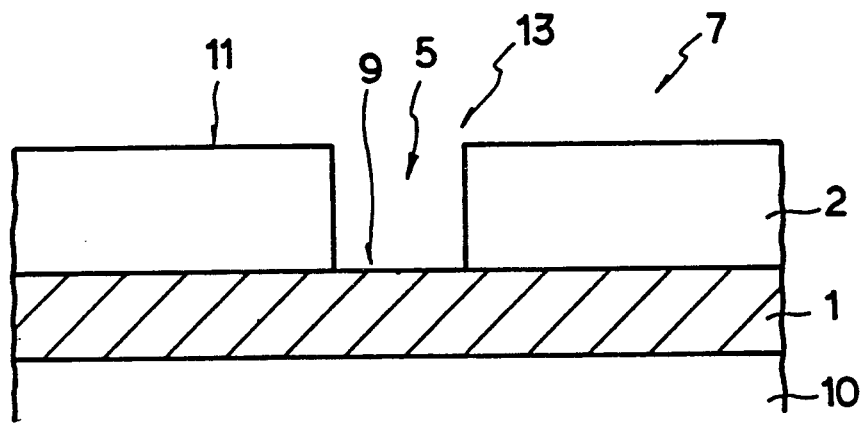
FIG. 1 illustrates a cross sectional view of the wafer in which an insulating layer is deposited on the conducting layer with a contact hole formed in the insulating layer according to the process of the present invention.

FIG. 1 illustrates the conducting layer 1 deposited on the wafer 10 and an insulating layer 2, for example, an oxide layer, deposited on the conducting layer 1. A contact hole 5 is formed by dry-etching a portion of the insulating layer 2 utilizing a contact mask patterning process, to expose a portion of the underlying conducting layer 1. At this stage, due to the formation of the contact hole 5 in the insulating layer 2, a step difference 13 occurs in the resulting structure 7 of the wafer 10. The step difference 13 is the difference in height between the top 11 of the insulating layer 2 and the conducting layer 1 exposed at the bottom 9 of the contact hole 5, i.e. the depth or thickness of the insulating layer 2.

Figure 2:
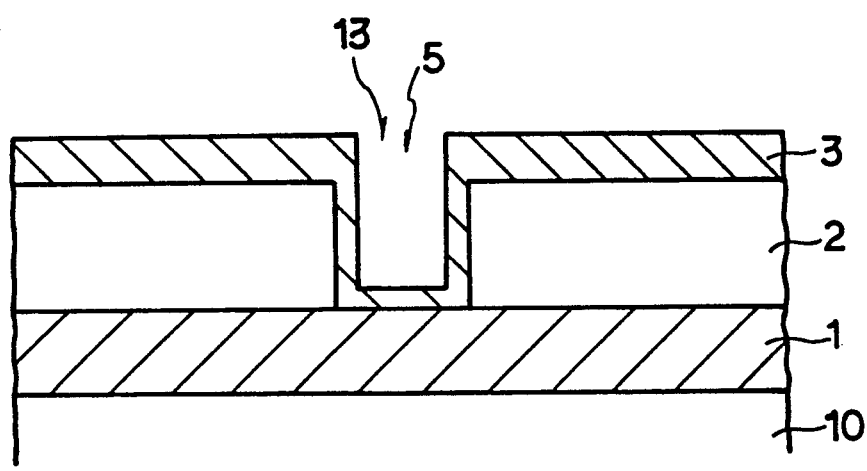
FIG. 2 illustrates a cross sectional view of the wafer in which a first metal layer is deposited on the insulating layer including a contact hole according to the process of the present invention.

Referring to FIG. 2, the resulting wafer 10 of FIG. 1 is introduced into a first chamber which is not shown in the drawing. The insulating layer 2 is then degassed at a temperature of above 400 degree Celsius for a period of two minutes. The temperature is then lowered to below 150 degrees Celsius and the first metal layer 3 is deposited on the insulating layer 2 and on the contact hole 5 to thickness corresponding to 30% of the final desired predetermined thickness of the metal layer. Preferably, the temperature is lowered to room temperature before the first metal layer is deposited. The temperature is lowered to below 150 degrees Celsius to ensure that the metal layer is applied as a uniform layer, i.e. absent any holes or voids which would leave the conducting layer 1 exposed, anywhere over the entire area of the insulating layer 2 and especially the side wall area of the contact hole 5.

Figure 3:
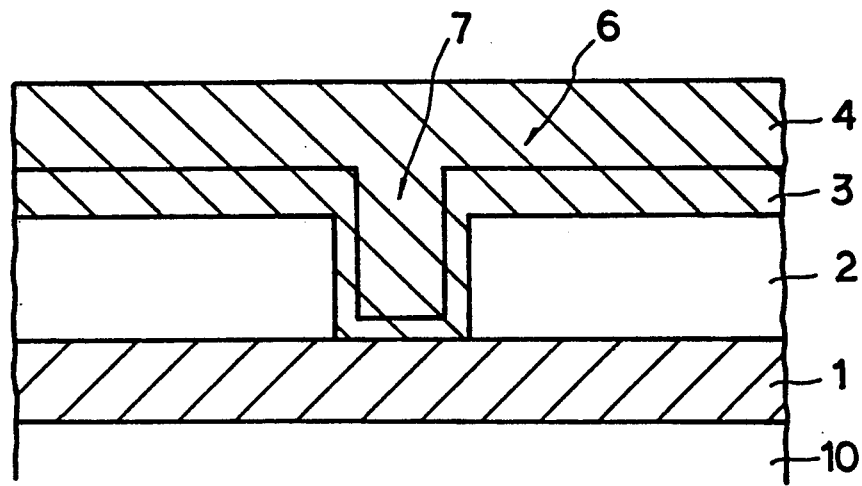
FIG. 3 illustrates a cross sectional view of the wafer in which planarization of the resulting metal layer is obtained by depositing a second metal layer on the first metal layer according to the process of the present invention.

Referring to FIG. 3, the resulting wafer 5 in connection with FIG. 2 is introduced into a second chamber (not shown in the drawings). The wafer 10 is then heated at a temperature of above 400 degree Celsius for a period of 1 minute in the second chamber. A second metal layer 4 is deposited on the first metal layer 3 to the remaining 70% thickness relative to a predetermined final thickness, at a temperature of above 400 degrees Celsius. Therefore, a final metal layer 6 including the first metal layer 3 and the second metal layer 4 is formed as being flat on the structure 7 having a step difference 13, i.e. planarized.

The first and second metal layer 3 and 4 are preferably aluminum or aluminum alloy.

It is noted that the process described in connection with FIG. 2 and FIG. 3 is performed sequentially utilizing two sputtering chambers, that is, a first and a second sputtering chamber, in which the vacuum of the chambers is below $5.0 \times 10^{-8}$ Torr and the power thereof is below 5 KW, during the degassing of the insulating layer 2 and heating of the chamber.

During the deposition of the metal layers, first on the insulating layer and second on the first metal layer (as shown in FIGS. 2 and 3) the chambers are pressured by argon gas to about 7 m Torr.

The percentages of 30% (first metal layer) and 70% (second metal layer) are the preferred percentages. The percentages may range from about 10 to 50% (first layer) and about 50 to 90% (second layer). Thus, the inventive step involves the laying down the metal layer in two steps at different process conditions in order to attain a planarized metal layer.

As described above, according to the present invention, the planarization of the resulting surface of the final deposited metal layer is accomplished without having any step difference in semiconductor device. Furthermore, the electromigration phenomenon which occurs in the prior art metal layer and the hillock phenomenon occurring during the prior art process forming the metal layer are avoided so that the properties of the resulting semiconductor device according to the present invention are improved.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for manufacturing a planarized metal layer on a structure having a step difference in semiconductor device comprises:

providing a wafer 10;

sequentially depositing a conducting layer 1 and an insulating layer 2 on the wafer 10;

forming a contact hole 5 by removing a portion of the insulating layer 2 to expose a portion of the underlying conducting layer 1, thereby producing structure 7 having a step difference;

introducing the resulting wafer 10 into a first chamber for degassing the insulating layer 2 at a predetermined temperature for a predetermined period;

depositing a first metal layer 3 on the entire surface of the resulting structure including the insulating layer 2 and the contact hole 5 to a 30% thickness relative to a predetermined thickness, which is to be finally deposited, at a predetermined temperature in the first chamber, thereby connecting the first metal layer 3 to the exposed portion of the conducting layer 1 through the contact hole 5;

introducing the resulting structure including the first metal layer 3 deposited on the wafer 10 into a second chamber; and, depositing a second metal layer 4 on the first metal layer 3 to the remaining 70% thickness of the predetermined thickness to be finally deposited at a predetermined temperature in the second chamber, thereby forming a planarized metal layer 6 including the first and the second metal layer 3 and 4 on the structure 7 having the step difference of the wafer 10.

2. The method of claim 1, wherein the insulating layer 2 is oxide.

3. The method of claim 1, wherein the first and second metal layer 3 and 4 are aluminum or aluminum Alloy.

4. The method of claim 1, wherein the first and second chamber maintain conditions that the vacuum of the chambers is below $5.0 \times 10^{-8}$ Torr, the power thereof is below 5 KW and the Argon pressure required for the chambers is 7 m Torr.

5. The method of claim 1, wherein the insulating layer 2 is degassed at a temperature of above 400 degree Celsius for a period of 2 minutes in the first chamber.

6. The method of claim 1, wherein the first metal layer 3 is deposited at a temperature of below 150 degree Celsius in the first chamber.

7. The method of claim 1, wherein the second metal layer 4 is deposited at a temperature of above 400 degree Celsius at the second chamber.

8. A method for manufacturing a planarized metal layer on a structure having a step difference in semiconductor device comprises:

providing an wafer 10;

sequentially depositing a conducting layer 1 and an insulating layer 2 on the wafer 10;

forming a contact hole 5 by removing a portion of the insulating layer 2 to expose a portion of the underlying conducting layer 1, thereby producing a structure having a difference on the wafer 10;

introducing the resulting wafer 10 into a first chamber for degassing the insulating layer 2 at a temperature of above 400 degree Celsius for a period of 2 minutes;

depositing a first metal layer 3 on the entire surface of the resulting structure including the insulating layer 2 and the contact hole 5 to a 30% thickness relative to a predetermined thickness, which is to be finally deposited, at a temperature of below 150 degree Celsius in the first chamber, thereby connecting the first metal layer 3 to the exposed portion of the conducting layer through the contact hole 5;

introducing the resulting structure including the first metal layer 3 deposited on the wafer 10 into a second chamber; and, depositing a second metal layer 4 on the first metal layer 3 to the remaining 70% thickness of the predetermined thickness to be finally deposited at a temperature of above 400 degree Celsius in the second chamber, thereby forming a planarized metal layer 6 including the first and the second metal layer 3 and 4 on the structure 7 having the step difference of the wafer 10.

9. The method of claim 8, wherein the insulating layer 2 is oxide.

10. The method of claim 8, wherein the first and second metal layer 3 and 4 are aluminum or aluminum alloy.

11. The method of claim 8, wherein the first and second chamber maintain conditions that the vacuum of the chambers is below $5.0 \times 10^{-8}$ Torr, the power thereof is below 5 KW and the Argon pressure required for the chambers is 7 m Torr.

12. A method for manufacturing a planarized metal layer on a wafer of a semiconductor device having a step difference, said method comprises:

providing a wafer;

sequentially depositing a conducting layer 1 and an insulating layer 2 on the wafer 10;

forming a contact hole in a portion of the insulating layer 2 exposing a portion of the underlying conducting layer 1 and simultaneously forming a step difference;

introducing the resulting wafer 10 comprising the contact hole into a first chamber and heating the wafer in order to degas the insulating layer 2 and depositing a first metal layer 3 on the degassed insulating layer 2 and on the contact hole 5 to a thickness of about 10 to 50% of the desired predetermined final thickness; and introducing the resulting wafer comprising the first metal layer into a second chamber and heating the wafer 10 and depositing a second metal layer 4 on the first metal layer 3 to a thickness of about 50 to 90% of the desired predetermined final thickness to provide a planarized metal layer.

13. The method of claim 12 wherein the contact hole is formed by dry-etching a portion of the insulating layer 2 by a contact mask patterning process.

14. The method of claim 12 wherein the insulating layer 2 is degassed in the first chamber at a temperature of above 400 degree Celsius for a period of two minutes.

15. The method of claim 12 wherein the first metal layer is deposited on the insulating layer 2 at a temperature of below 150 degrees Celsius to ensure the continuity of the first metal layer.

16. The method of claim 15 wherein the degassed insulating layer is allowed to cool to room temperature before depositing the first metal layer on the resulting wafer comprising the contact hole.

17. The method of claim 12 wherein the resulting wafer comprising the first metal layer deposited on the insulating layer is heated in the second chamber to a temperature of above 400 degrees Celsius for a period of 1 minute.

18. The method of claim 12 wherein the second metal layer 4 is deposited on the first metal layer 3 in a temperature of above 400 degrees Celsius.

19. The method of claim 12 wherein the first and second metal layer 3 and 4 are selected from the group consisting of aluminum or aluminum alloy.

20. The method of claim 12 wherein the first metal layer is deposited on the degassed insulating layer 2 and on the contact hole 5 to a thickness of about 30% of the desired predetermined final thickness of the metal layer; and the second metal layer is deposited on the first metal layer 3 to a thickness of about 70% of the desired predetermined final thickness of the metal layer.

21. A method for manufacturing a planarized metal layer on a wafer of a semiconductor device having a step difference, said method comprises:

providing a wafer of the semiconductor device;

sequentially depositing a conducting layer 1 and an insulating layer 2 on the wafer 10;

forming a contact hole in a portion of the insulating layer 2 by dry-etching a portion of the insulating layer 2 by a contact mask patterning process to expose a portion of the underlying conducting layer 1 and simultaneously form a step difference;

introducing the resulting wafer 10 comprising the contact hole into a first chamber and heating the wafer at a temperature of above 400 degree Celsius for a period of two minutes to degas the insulating layer 2;

allowing the degassed insulating layer 2 to cool to room temperature before depositing a first metal layer on the resulting wafer comprising the contact hole;

depositing the first metal layer 3 on the degassed insulating layer 2 and on the contact hole 5 to an extent of about 30% of the desired predetermined final thickness at room temperature; and introducing the resulting wafer comprising the first metal layer into a second chamber and heating to a temperature of above 400 degrees Celsius for a period of 1 minute and depositing a second metal layer 4 on the first metal layer 3 to a thickness of about 70% of the desired predetermined final thickness to provide a planarized metal layer.

* * * * *